United States Patent [19]

Matsushita

[11] Patent Number: 4,701,914
[45] Date of Patent: Oct. 20, 1987

[54] APPARATUS FOR CORRECTING CYCLIC CODE DATA STORED IN MEMORY AND METHOD THEREFOR

[75] Inventor: Akira Matsushita, Fukaya, Japan

[73] Assignee: Kabushiki Kaisha Toshiba, Kawasaki, Japan

[21] Appl. No.: 780,605

[22] Filed: Sep. 26, 1985

[30] Foreign Application Priority Data

Sep. 26, 1984 [JP] Japan .................................. 59-199651
Sep. 28, 1984 [JP] Japan .................................. 59-201915

[51] Int. Cl.⁴ .............................................. G06F 11/00
[52] U.S. Cl. .......................................... 371/13; 371/38
[58] Field of Search ....................... 371/13, 38, 37, 43, 371/44, 45

[56] References Cited

U.S. PATENT DOCUMENTS

| | | | |
|---|---|---|---|
| 3,873,971 | 3/1975 | En ........................................... | 371/43 |
| 4,119,945 | 10/1978 | Lewis ..................................... | 371/43 |
| 4,317,202 | 2/1982 | Markwitz .............................. | 371/43 |
| 4,335,459 | 6/1982 | Miller ..................................... | 371/38 |
| 4,397,022 | 8/1983 | Weng ..................................... | 371/37 |
| 4,404,674 | 9/1983 | Rhodes .................................. | 371/43 |
| 4,414,666 | 11/1983 | Nelson .................................. | 371/37 |
| 4,476,458 | 10/1984 | Dollard ................................ | 371/43 |
| 4,519,080 | 5/1985 | Snyder ................................. | 371/43 |

Primary Examiner—Michael R. Fleming
Attorney, Agent, or Firm—Cushman, Darby & Cushman

[57] ABSTRACT

According to one aspect of the present invention, an apparatus for error correction is comprised of a data storing section for storing data to be corrected, the data including a data field and an error correction field comprised of a predetermined number of bits. The apparatus also comprises a data readout section for reading out, at a first timing, the data to be corrected from the data storing section into a first line, and for reading out, at a second timing, into a second line, the error detection section for fetching the data to be corrected as read out into the first line. The apparatus further comprises means for applying a predetermined operation to the data to be corrected, thereby generating, in synchronism with the second timing, correction data corresponding to the error data. A correction section is also used for periodically fetching both the data to be corrected as read out into the second line and the correction data generated by the error detection section. The data is also subjected to a predetermined correction processing to thereby produce corrected data. Finally, a data write section is used for storing into the data storing section the corrected data as output from the correction section.

10 Claims, 7 Drawing Figures

FIG. 5
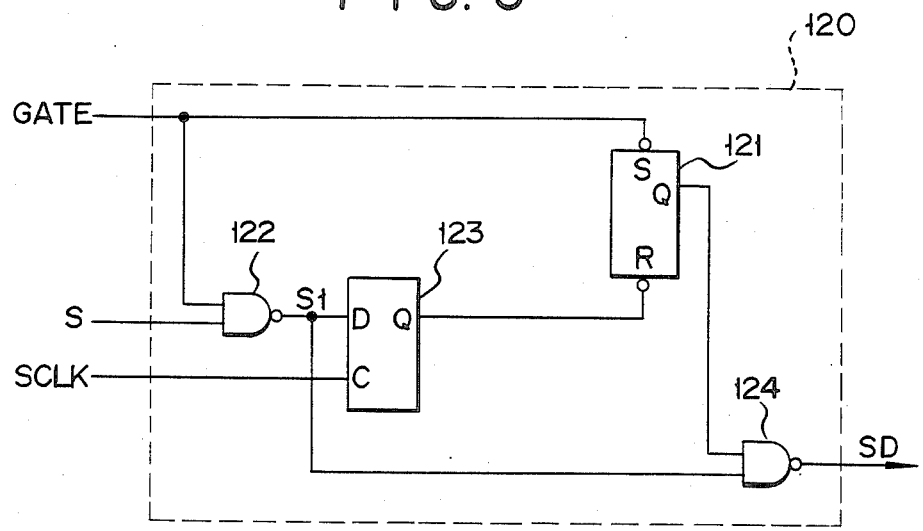
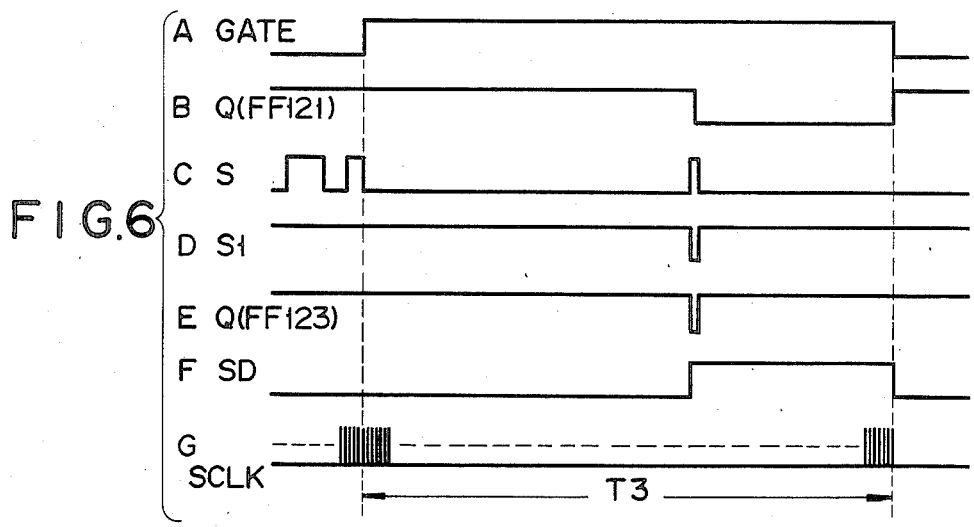
FIG. 6

FIG. 7

| ADDRESS | DATA | | | | | | | | |
|---|---|---|---|---|---|---|---|---|---|
| B0 | D0 | D1 | D2 | D3 | D4 | D5 | D6 | D7 | ⎫ |
| B1 | D8 | D9 | D10 | D11 | D12 | D13 | D14 | D15 | ⎪ |
| B2 | D16 | D17 | D18 | D19 | D20 | D21 | D22 | D23 | ⎬ a |
| ⋮ | | | | | | | | | ⎪ |
| B33 | D264 | D265 | D266 | D267 | D268 | D269 | D270 | D271 | ⎭ |
| ⋮ | | | | | | | | | |
| B0' | D0 | D1 | D2 | D3 | D4 | D5 | D6 | D7 | ⎫ |
| B1' | D8 | D9 | D10 | D11 | D12 | D13 | D14 | D15 | ⎪ |
| B2' | D16 | D17 | D18 | D19 | D20 | D21 | D22 | D23 | ⎬ b |
| ⋮ | | | | | | | | | ⎪ |
| B33' | D264 | D265 | D266 | D267 | D268 | D269 | D270 | D271 | ⎭ |
| B34' | S0 | S1 | S2 | S3 | S4 | S5 | S6 | S7 | ⎫ |
| B35' | S8 | S9 | S10 | S11 | S12 | S13 | S14 | S15 | ⎪ |
| ⋮ | | | | | | | | | ⎬ c |
| B44' | S80 | S81 | | | | | | | ⎭ |
| B45' | "FF" OR "00" | | | | | | | | } d |

APPARATUS FOR CORRECTING CYCLIC CODE DATA STORED IN MEMORY AND METHOD THEREFOR

BACKGROUND OF THE INVENTION

This invention relates to a method and apparatus for error correction, and more particularly to a method and apparatus for error correction suitable for use in, for example, a teletext system.

In a teletext system, a digital signal is superimposed on the horizontal scanning period in the vertical blanking period of a television signal. The conventional televison signal has no picture signal in this vertical blanking period of the horizontal scanning. The character transmission system of such a teletext system contains both a pattern transmission system in which character and picture data are dissolved into picture elements, and a coded transmission system in which the pictorial information is transmitted in the form of coded data. The coded transmission system is superior to the pattern transmission system in terms of the amount of pictorial information transmitted per unit time. The coded transmission system, however, has a problem in that a code error occuring during the transmission of data in the digital signal form is visualized as a miswritten or omitted word.

To cope with this problem, it has been proposed that the code error be corrected by improving the reliability of digital signal processing. A prior art correction system for such a purpose employs a (272,190) shortened (majority) difference set cyclic code system. This correction system is disclosed in the Report of the Radio Council (DENPA GIJUTSU SHINGIKAI) of Japan, Chapter 4, pp 171-190, and in Japanese patent disclosure (KOKAI) No. 59-133751. In this correction system, a majority difference set cyclic code of (273,191) is reduced in its required number of bits by one bit (this correction system being capable of dealing with a code error of a maximum of 8 bits), while retaining a correction capability. More specifically, a data field of 190 bits is associatively followed by an error correction field of 82 bits, which is generated by a predetermined polynomial generator. A total of 272 bits for the data field and the error correction field are thus contained in one data packet for transmission. On the receiving side, the received data packet is stored in a RAM. Then, a CPU reads out and transfers the data to a syndrome register of a predetermined number of bits (for example, 82 bits) and also to a shift register of 272 bits which acts as a delay circuit to synchronize the data with the output of corrected data.

In the syndrome register, the 272-bit data is operated upon several times. The syndrome operation is a kind of division in which, if no error is found in the data, the data is divided to provide a "0" output. The results of the syndrome operations are classified into a predetermined number of groups which are then supplied to a majority logic circuit. On the basis of the operation results, the majority logic circuit decides whether the data is to be corrected or not. The decision signal output from the majority logic circuit, together with the synchronizing output signal of the 272-bit shift register, is transferred to a correction circuit. The correction circuit, if the decision signal requires error correction, corrects the error and then writes the corrected data into the RAM.

As stated above, this correction system can correct a maximum of eight error bits in 272 bits of data, but it may fail to correct all the error bits in some cases. It is, therefore, necessary to check as to whether or not all the error bits have been corrected. This check is made in the following way.

First, the contents of the 82 registers provided in the syndrome register are checked. If the 82 bits stored in these registers are all "0's", all the error bits have been corrected. Otherwise, it is understood that all the error bits have not been corrected. Hence, the 82 bits from the syndrome register are ORed, and the CPU fetches the data showing this logical sum. The logical sum indicates correction of all the bits when its value is "0", and an incomplete correction of bits when its value is "1".

In the prior art system, the data to be corrected is outputted from the RAM to the syndrome register, and the corrected data is outputted from the syndrome register back to the RAM. The CPU performs both data transferring operations in accordance with a program designed (software) for this purpose. Therefore, the time taken for error correction depends largely on the input/output speed of the CPU. If, however, the processing time of the CPU is increased during the input/output operation, the CPU can not execute other processing, e.g., decoding processing of the received data. The CPU also often fails to follow up processing of the incoming data. Further, the prior art error correction control circuit uses the 272-bit shift register for synchronizing the output of the correction signal with the data. As a result, the error correction control circuit is large, a grave disadvantage when the error correction control circuit is fabricated into an integrated circuit.

For detecting a state of the error correction process, the outputs of the respective registers in the syndrome register are ORed. This large number, 82, of inputs requires extremely long wires, thereby adding to the overall size of the circuit and making it difficult to fabricate the error correction control circuit by means of IC technology.

SUMMARY OF THE INVENTION

It is, therefore, an object of the present invention to provide a new and improved method and apparatus which, in addition to error correction, can correct a data error at a high speed and requires no delay circuit for synchronizing the output of an error correction signal with the supply of the data to be corrected, thus leading to a reduction in the size of the circuit.

Another object of the present invention is to provide a method and apparatus for error correction for checking whether the data correction is made normally or abnormally using a relatively simple and small circuit.

According to one aspect of the present invention, there is provided an apparatus for error correction comprised of a data storing section for storing data to be corrected, the data including a data field and an error correction field comprised of a predetermined number of bits. The apparatus also comprises a data readout section for reading out, at a first timing, the data to be corrected from said data storing section into a first line, and for reading out, at a second timing, into a second line, the error detection section for fetching the data to be corrected as read out into the first line. The apparatus further comprises means for applying a predetermined operation to the data to be corrected, thereby generating, in synchronism with the second timing, correction data corresponding to the error data. A correction section is also used for periodically fetching both the data to be corrected as read out into the second line and the correction data generated by the error detection section. The data is also subjected to a predetermined correction processing to thereby produce corrected data. Finally, a data write section is used for storing into the data storing section the corrected data as output from the correction section.

BRIEF DESCRIPTION OF THE DRAWINGS

These and other objects and features of the present invention can be understood by referring to the accompanying drawings, in which:

FIG. 5 is a circuit diagram partially illustrating, in detail, the block diagram of FIG. 1;

FIG. 6 shows timing charts illustrating the operation of the circuit diagram of FIG. 5; and FIG. 7 shows the process of storing contents for explaining the operation of the circuit diagram of FIG. 5.

DETAILED DESCRIPTION OF THE PREFERRED EMBODIMENT

An embodiment of a method and apparatus for error correction according to the present invention will be described with reference to the accompanying drawings. For ease of explanation, the error correction method and apparatus will be applied to a receiver in a teletext system based on a coded transmission system. Further, the method and apparatus for error correction according to this embodiment employs as a correction system, a (272, 190) shortened (majority) difference set cyclic code.

Figure 1:
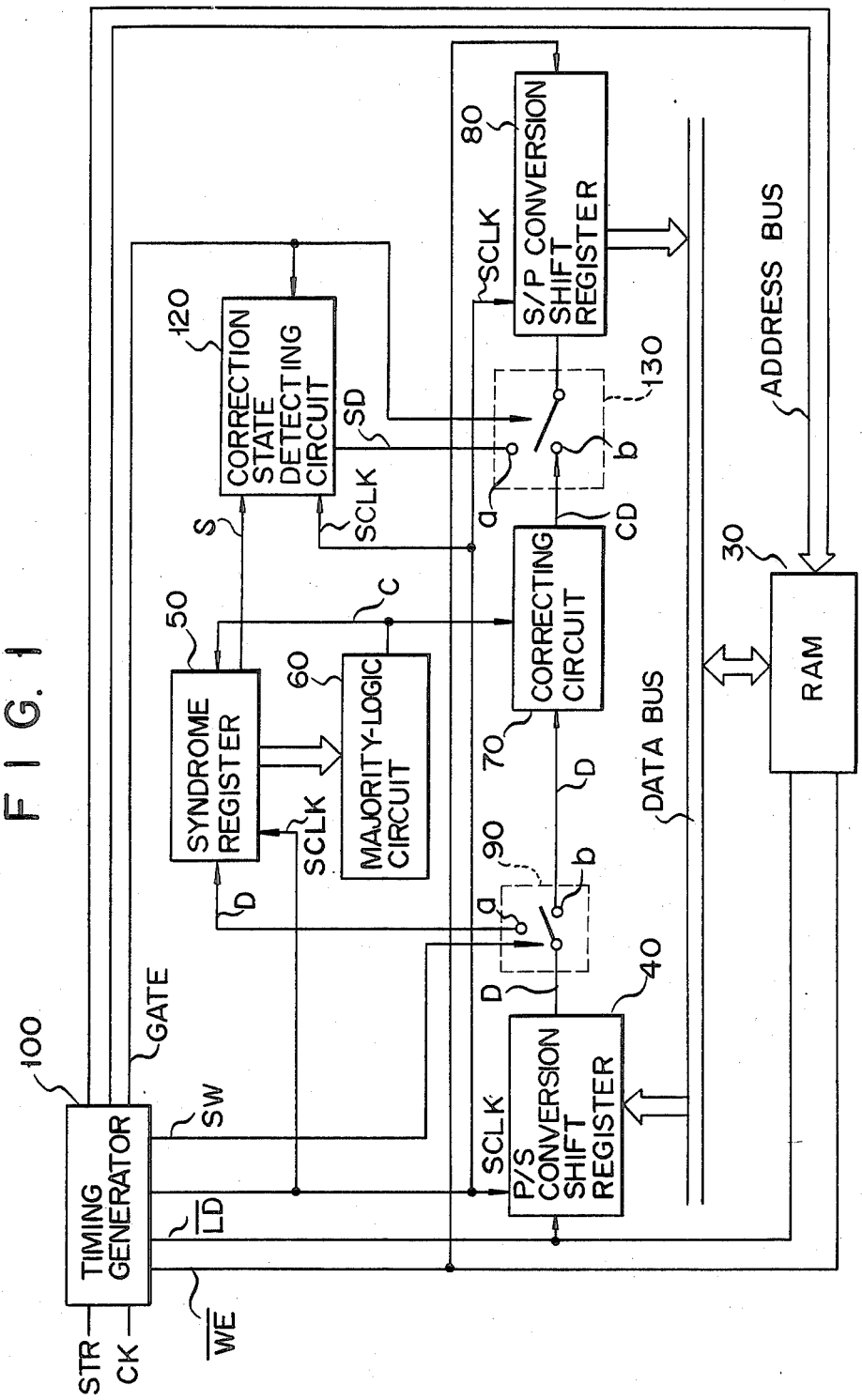
FIG. 1 is a block diagram illustrating a method and apparatus for error correction according to an embodiment of the present invention.

A scheme of the method and apparatus for error correction will be described with reference to FIG. 1. In FIG. 1, a RAM 30 stores data of 272 bits consisting of a data field and an error correction field which are contained in one data packet of a character broadcasting signal. After the correction operation ends, the corrected data is stored back into the RAM 30. The input operation of data to the RAM 30 upon receiving the character broadcast signal and the input/output operation of data to and from the RAM 30 after the end of the correction operation are under the control of a CPU and a program ROM. However, in the correction operation and correction state detecting operation, the input/output operation of data to and from the RAM 30 is out of the control of the CPU and the ROM. A parallel/serial (P/S) conversion shift register 40 converts parallel data of 8 bits, as read out of the RAM 30 every 8 bits, into serial data D. The serial data D is applied to a syndrome register 50 through a switch 90, whose movable contact is connected to fixed contact a in this condition, as described later.

The syndrome register 50 comprises a shift register of 82 bits which applies a predetermined syndrome operation to the serial data D. A majority logic circuit 60 then decides, on the basis of the syndrome data produced as a result of the syndrome operation, whether the serial data D is to be corrected or not. In the majority logic circuit 60, the syndrome data supplied from the syndrome register 50 is arranged into a predetermined number, i.e. 17, of groups. Each group of syndrome data is subjected to the exclusive OR operation. If 10 or more of the 17 groups of syndrome data give an exclusive OR output of "1", the majority logic circuit 60 decides that the data contains an error and produces a correcting signal C. The correcting signal C is applied to a correcting circuit 70 comprising an exclusive OR gate and is used to initiate correction of the serial data D output from the P/S conversion shift register 40. The correcting signal C is also applied as a syndrome reset pulse to the syndrome register 50 to clear the syndrome register 50.

Figure 2:
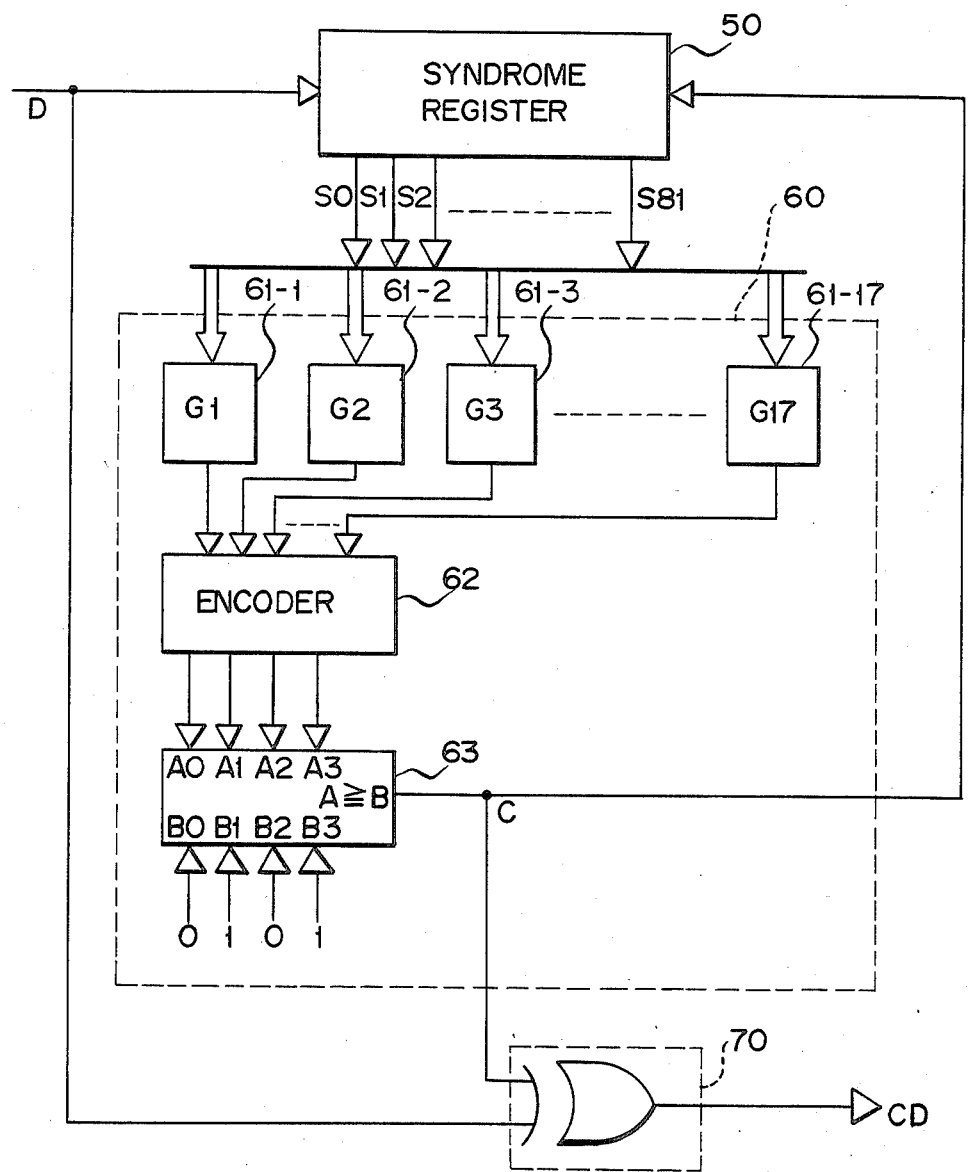
FIGS. 2 and 3 show circuit diagrams partially illustrating, in detail, the block diagram of FIG. 1.

The majority logic circuit 60 includes adders 61-1 to 61-17, an encoder 62, and a comparator 63 as shown in FIG. 2. The 82-bit shift register of the syndrome register 50 produces output signals S0 to S81. These 82 bit output signals are arranged into seventeen groups G1 to G17, as shown in Table 1:

TABLE 1

| Group | Register Output |
| --- | --- |
| G1 | $S_{64}$ |
| G2 | $S_5, S_{10}$ |
| G3 | $S_{76}, S_{58}$ |
| G4 | $S_{60}, S_{54}, S_{36}$ |
| G5 | $S_{32}, S_{50}, S_{56}, S_{78}$ |
| G6 | $S_3, S_{25}, S_{29}, S_{46}$ |
| G7 | $S_{16}, S_{20}, S_{37}, S_{73}$ |
| G8 | $S_{79}, S_{70}, S_{34}, S_{17}, S_{13}$ |
| G9 | $S_7, S_9, S_{40}, S_{47}, S_{48}, S_{67}, S_{77}$ |
| G10 | $S_{15}, S_{33}, S_{39}, S_{61}, S_{65}$ |
| G11 | $S_{26}, S_{35}, S_{38}, S_{49}, S_{51}$ |
| G12 | $S_2, S_6, S_{23}, S_{59}, S_{68}, S_{71}$ |
| G13 | $S_{19}, S_{28}, S_{31}, S_{42}, S_{44}, S_{75}$ |
| G14 | $S_0, S_4, S_{21}, S_{57}, S_{66}, S_{69}, S_{80}$ |
| G15 | $S_{18}, S_{27}, S_{30}, S_{41}, S_{43}, S_{74}, S_{81}$ |
| G16 | $S_8, S_{11}, S_{22}, S_{24}, S_{55}, S_{62}, S_{63}$ |
| G17 | $S_1, S_{12}, S_{14}, S_{45}, S_{52}, S_{53}, S_{72}$ |

These groups are exclusively ORed by the adders 61-1 to 61-17. The one bit output signals of the adders 61-1 to 61-17 are bonded into a binary system, which corresponds to the number of logical "1's" in the output signals. For example, if the output signals of the adders are "10110011101010110", ten logical "1's" are present. For such outputs, the encoder 62 produces "1010" as an output signal. This encoder output is compared with "1010" by the comparator 63. If it is above "1010", the majority logic circuit 60 decides that the data contains an error and produces the correcting signal C.

The corrected data CD is supplied from the circuit 70 to a serial/parallel (S/P) conversion shift register 80 through a switch 130 which is turned to contact b in this condition. The shift register 80 converts the data CD back into 8-bit parallel data. This parallel data is then stored back in the RAM 30. In the meantime, the switch 90 has been turned to contact b, and the serial data D has been supplied from the P/S conversion shift register 40 to the correcting circuit 70. The data D, which is to be corrected, is thus synchronized with the correcting signal C. A timing generator 100 generates a clock signal CK, thus controlling the operation timings of the circuits when the error correction control circuit functions accurately.

The correction state detecting circuit 120 is provided for checking whether or not the correction, as performed, is correct. The correction state detecting circuit 120 reads in bit by bit the syndrome data S. When detecting logical "1", the circuit 120 holds its state. The syndrome data S and the data SD representing a detection state are stored into the RAM 30 through the switch 130, whose movable contact is connected to fixed contact a in this condition and the S/P conversion shift register 80 as will be described below.

Figure 3:
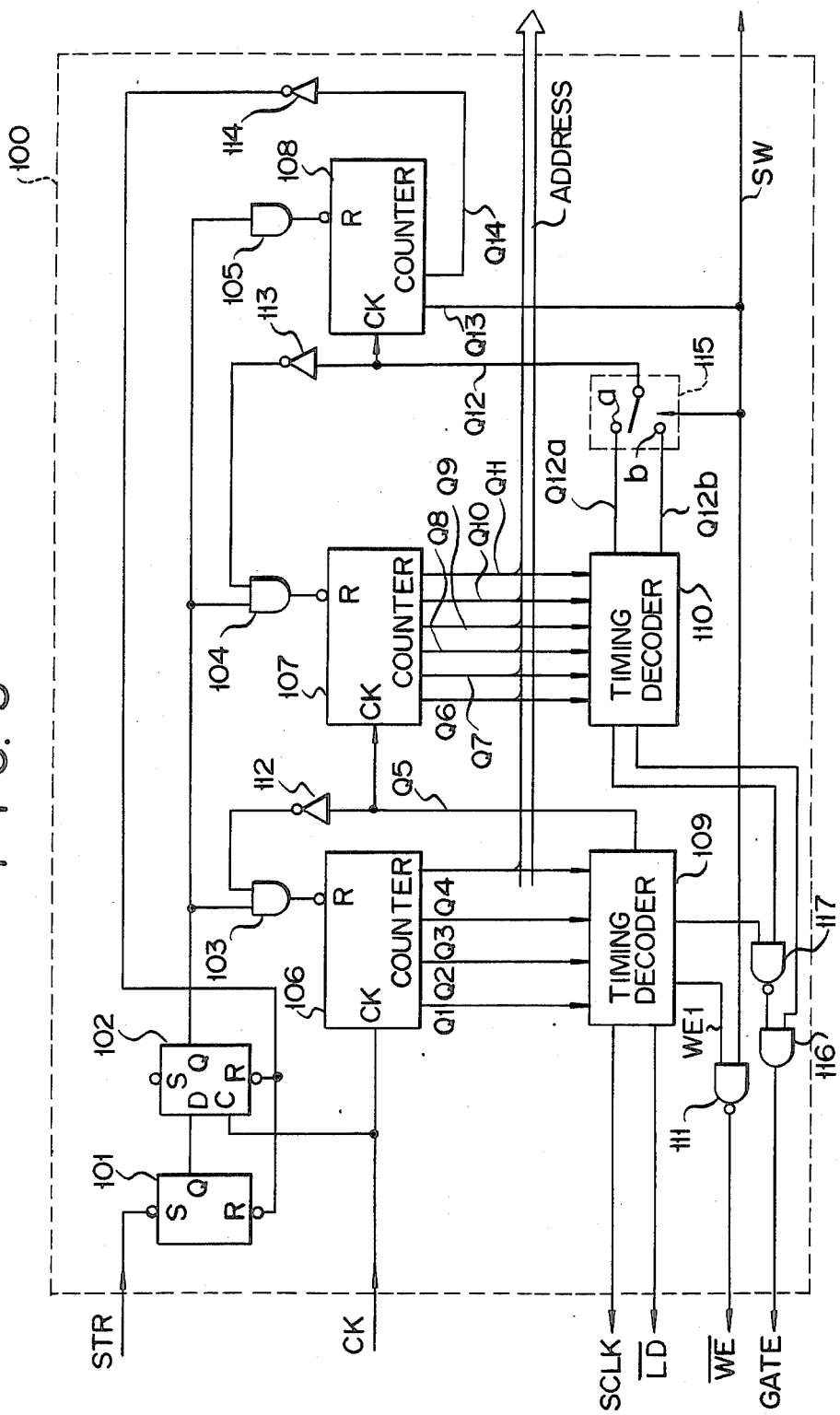
Figure 4:
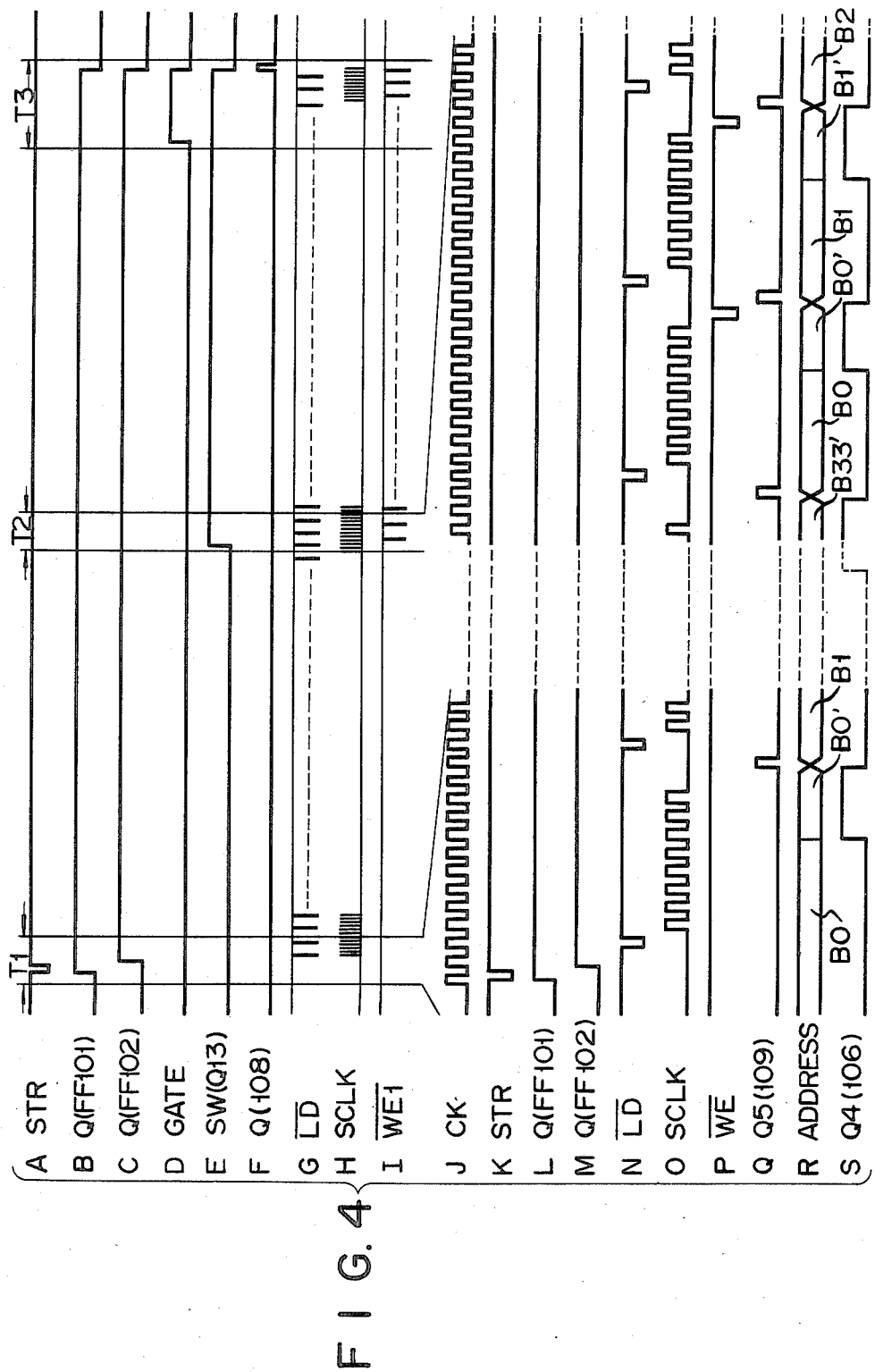
FIG. 4 shows timing charts useful in explaining the operation of the block diagram of FIG. 1.

The operation of the embodiment thus arranged will be described with reference to FIGS. 3 and 4.

As seen from the foregoing, the embodiment executes the correction operation and the correction state detecting operation without using a CPU.

The correction operation includes two operations. In the first correction operation, the data represented by the 272 bits, which is intended for correction and which is stored in the RAM 30, is written into the syndrome register 50 by way of the P/S conversion shift register 40. The syndrome register 50 then performs the syndrome operation on the received data.

Then, in the second correction operation, the majority logic circuit 60 decides on the basis of the output data from the syndrome register 50 whether or not the data is to be corrected. Then, the uncorrected data is read out again from the RAM 30 and corrected by the correcting circuit 70. The corrected data is then stored back into the RAM 30.

In the correction state detecting operation, the syndrome data S stored in the syndrome register 50 is supplied to the correction state detecting circuit 120. The correction state detecting circuit 120 detects a correction state and writes it into the RAM 30.

The above correction operation starts upon the output of a start signal STR by a CPU (not shown) to the timing generator 100. The timing generator will be described referring to FIGS. 3 and 4, which illustrate the detail of the timing generator 100 and its timing signals. As shown in FIG. 3, the start signal STR (FIG. 4A) is applied to a set terminal S of an SR(set/reset) flip-flop (referred to as FF) 101. Upon receipt of this, the Q output (FIG. 4B) of the FF101 goes to high level of "H". The Q output (FIG. 4C) of a D(delay)-FF 102 at the next stage also goes to high level of "H" at the leading edge of a clock signal CK (FIG. 4J). The Q output of the high level of "H" is applied to AND gates 103 to 105 to remove the reset states of counters 106 to 108. As a result, these counters start to count the clock signal CK. The output signals Q1 to Q4 from the counter 106 are applied to a timing decoder 109. The decoder 109 decodes these output signals to generate various types of pulses $\overline{LD}$, SCLK, and $\overline{WE}$ (FIGS. 4G–I) for controlling the one-byte data and a reset pulse Q5 for resetting the counter 106. The counter 107 counts the output signal Q5 as a clock signal CK and produces output signals Q6 to Q11 or 6 bits, which are in turn applied to a timing decoder 110.

Using these signals, the decoder 110 checks whether the control of 34 bytes has been completed or not. The timing decoder 110 produces signals Q12a and Q12b to specify the first and second correction operations and the correction state detecting operation. Either of these signals is selectively applied as a clock signal CK to the next stage counter 108 through a switch 115 to be described later. Specifically, the signal Q12a is produced when the count of the counter 107 reaches 34 to specify the first correction operation (period T1) which processes every 34 bytes. The signal Q12b is produced when the count of the counter 107 reaches 46, to specify the second correction operation and correction state detecting operation (periods T2 and T3) which processes every 46 bytes. The counter 108 counts with the clock of either of the outputs Q12a or Q12b. When the output Q13 of the counter 108 has a low level of "L", execution of the first correction operation is allowed. At a high level of "H" of the output Q13, execution of the second correction operation and correction state detecting operation are allowed. The output Q13 thus serves as a switch signal (FIG. 4E) to drive the switch 90 (FIG. 1) and also switch 115 provided in the timing generator 100 to allow either of the signals Q12a and Q12b to pass as a clock CK to the counter 108.

The timing decoder 110 produces a gate signal GATE (FIG. 4D) by which to distinguish the second correction operation and correction state detecting operation from one another. The gate signal GATE switches the switch 130. At the end of the second correction operation and correction state detecting operation, the output Q14 of the counter 108 (FIG. 4F) goes to high level of "H", and the FFs 101 and 102 are reset via an inverter 114, resulting in termination of all the operations.

The first correction operation will now be described in more detail using FIGS. 4J to 4S, which are enlargements of the FIGS. 4A to 4I waveforms. This first correction operation starts in response to the start signal STR (FIG. 4K). The timing decoder 109 for controlling one byte of data produces various pulse signals. The one byte operation is performed by eleven clocks CK (FIG. 4J). In response to a load pulse $\overline{LD}$ (FIG. 4N), one byte of data which is readout from the RAM 30 is loaded into the P/S conversion shift register 40 by way of the data bus. An address (FIG. 4R) of the RAM 30 is applied at this time in the form of the output signals Q6 to Q11 (collectively denoted as B0) of the counter 107 to effect control of 34 bytes. Then, eight shift clocks SCLK (FIG. 4O) are produced, so that the P/S conversion shift register 40 produces the serial data D. At this time, the output Q13 of the counter 108, i.e. the switch signal SW (FIG. 4E) is low; therefore, the movable contact of the switch 90 is connected to contact a. The serial data D thus goes to the syndrome register 50 where it is syndrome operated. Immediately upon the timing of the 8th shift clock SCLK, the decoder 109 produces a write pulse $\overline{WE1}$. This pulse, however, is blocked by the NAND gate 111, which is responsive to the switch signal SW, so a write pulse $\overline{WE}$ (FIG. 4P) is not produced. Therefore, data write into the RAM 30 is not performed. At the 11th clock pulse, the decoder 109 produces the output Q5 (FIG. 4Q). With application of this output, the counter 107 is counted up. The output Q5 is also applied to the reset terminal R of the counter 106 through an inverter 112 and an AND gate 103. By this output Q5, the counter 106 is reset.

The writing of one byte data for the 11 clock duration is repeated 34 times. When the data of 34 bytes (272 bits) has been input to the syndrome register 50, the decoder 110 produces the output signal Q12a. At this time, the switch 115 is at the contact a since the output Q13 of the counter 108 became low. Thus, with connection of the switch contacts, the signal Q12a goes as a signal Q12 to the counter 108. By this signal, the counter 108 is counted up. The counter 107 is reset by the output signal Q12 coming through the inverter 113 and the AND gate 104. The output signal Q13 of the counter 108 becomes high (FIG. 4E), and the switch 115 is switched to the contact b. Here, the first correction operation ends and the second correction operation begins.

The second correction operation also will be described with reference to FIGS. 4J to 4S, which are enlargements of the FIGS. 4A to 4I waveforms. In this operation the majority logic circuit 60 uses the operation result from the syndrome register 50 to decide whether or not the data is to be corrected. Then, the data is again loaded in the RAM 30 through the correcting circuit 70. As in the first correction operation, the load pulse $\overline{LD}$ (FIG. 4N) is applied to the RAM 30 and the P/S conversion shift register 40. Data of one byte, stored at the memory location of the address B0 (FIG. 4R), is read out and loaded into the P/S conversion shift register 40. The parallel data of one byte is output in the order loaded as the serial data D in response to the shift clock signal SCLK (FIG. 4O). At this time, the switch signal SW (FIG. 4E) has a high level, as already described. Accordingly, the switch 90 is switched to the contact b, and the serial data D is supplied to the correcting circuit 70. Simultaneously, the result of the syndrome operation output from the syndrome register 50 is checked by the majority logic circuit 60. Responsive to the correcting signal C output bit by bit, the serial data D is corrected in the correcting circuit 70. The corrected data CD is then stored bit by bit into the S/P conversion shift register 80 in synchronism with the shift clock signal SCLK.

The method of writing the corrected data into the RAM 30 now will be described.

In the initial state, a total of 272 bits constituting the data field and the correction field in the character broadcast signal have been stored in the RAM 30. These data are sequentially stored into the RAM 30 in the incoming order of the data, byte by byte, as shown in FIG. 7a. The uncorrected data thus stored into the RAM 30 are read out and corrected as described above.

The corrected data is again stored into another area of the RAM 30 in the following manner. The serial data D of 8 bits are corrected by the eight shift clocks SCLK and stored into the S/P conversion shift register 80. Then, the timing decoder 109 produces a write pulse $\overline{WE1}$. At this time, the switch signal SW (FIG. 4E) is high in level, and hence the NAND gate 111 produces a write pulse $\overline{WE}$ (FIG. 4P). The corrected data stored in the shift register 80 then is written into the RAM 30, which is the data unit for processing in the manner of FIG. 7b. The address of the RAM 30 to which the corrected data is written (see FIG. 4R) is the address B0', determined by the outputs Q6 to Q11 of the counter 107 and the output Q4 of the counter 106 (FIG. 4S).

In this way, the correction operation of one byte of data, which continues for the duration of 11-clocks, is repeated 34 times to store the data D0 to D271 into the RAM 30, as shown in FIG. 7b. At this time, the output Q13 (FIG. 4E) is high therefore, the movable contact of the switch 115 is connected to fixed contact b. Under this condition, the output Q12b, produced when the count of the counter 107 is 45, is allowed to be output as the output Q12. At this time, however, the output Q12 is not yet produced. Therefore, the counter 108 is not counted up, and the output Q14 is not output. The instant the count of the counter 107 reaches 34, the gate signal GATE (FIG. 4D) goes high. Subsequently, the high level is sustained until the count of the counter 107 reaches 46. As a result, the switch 130 is turned to the contact a. Then, during the period T3 in FIG. 4, the correction state detecting operation is performed.

The correction state detecting operation will be described with reference to FIGS. 5 and 6.

In FIG. 5, illustrating in detail the correction state detecting circuit 120, the output Q of FF 121 produces a high level signal during the period that the gate signal GATE is low, that is, during the period other than that of the correction state detecting operation. The state of the syndrome data S is detected by a NAND gate 122 and FF123. The FF121 retains its state, and NAND gate 124 produces as the syndrome data SD the retained result and applies it to the S/P conversion shift register 80.

The operation of the correction state detecting circuit 120 will be described with reference to FIG. 6 which illustrates waveforms at respective portions of the correction state detecting circuit 120.

As a first step, the gate signal GATE (FIG. 6A) goes high to remove the reset state of the FF121. The NAND gate 122 is enabled by the gate signal GATE to allow only syndrome data S1 representing error data (FIG. 6D) of the syndrome data S (FIG. 6C) to pass through it. This data S1 is latched in FF123 in response to the shift clock SCLK (FIG. 6G) to produce the output Q (FIG. 6E). If syndrome S is logical "0", the FF121 continuously produces a high level signal without being reset. The NAND gate 124 thus produces a correction state signal SD of logical "0" (FIG. 6F).

When the syndrome data S of logical "1" is input to the correction state detecting circuit 120, the data S1 goes low. The data S1 is latched by the FF123. Then, the Q output of the FF123 becomes low in level so that the FF 121 is reset. The Q output of the FF121 also becomes low. Subsequently, the output Q is retained without regard to the syndrome data S. Accordingly, the correction state signal SD is kept at a high level.

The correction state signal SD is supplied through the switch 130 to the register 80. Then, the signal SD is stored into the memory locations B34' and B44' of the ROM30, as in the second correction operation. FIG. 7C illustrates the stored state of the signal SD in the RAM 30.

Even after the syndrome data S of 82 bits is stored into the correction state detecting circuit 120, the shift clock SCLK is still supplied to store the correction state signal SD into the memory location of the address B45' in the RAM 30. At this time, if even one bit data is contained in the syndrome data of 82 bits, as described above, the correction state signal SD goes high. Accordingly, when the data is abnormally corrected as shown in FIG. 7d, all of the one byte data are stored in the address B45' as 1's (FF). Conversely, when it is normally corrected, all 0's (00) are stored therein. Therefore, whether the correction was normal or abnormal can be detected by the CPU using the contents of the address B45'.

When storage of the 46 bytes of data is completed, the decoder 110 produces the output Q12b. This output Q12b is applied as the output Q12 to the counter 108. Upon receipt of this, the counter 108 produces an output signal Q14 (FIG. 4F). The output Q14 is applied to the reset terminal R of the FFs 101 and 102 through the inverter 114 to reset the FFs 101 and 102. Accordingly, the counters 106 to 108 are reset and stop their count operations. At this point, the first and second correction operations and correction state detecting operation end.

As seen from the foregoing, the specially arranged hardware is employed for the writing of the data designated for correction into the syndrome register 50, as well as for the reading of the corrected data from the S/P conversion shift register 80. This feature reduces the time taken for outputting the data and speeds up the error correction operation of the error correction control circuit. The timing of reading out the data D designated for correction into the P/S conversion shift register 40 from the RAM 30 is used for synchronizing the correcting signal C to decide whether or not the data D is to be corrected with that data D. This feature eliminates the shift register of 272 bits, which was essential to the prior art circuit. The fact that such a register is not needed simplifies the circuit arrangement of the error correction control circuit. The simplified circuit arrangement makes IC fabrication of the error correction control circuit easy.

For detecting the error correction state, the correction state detecting circuit 120 reads out bit by bit the syndrome data S of 82 bits stored in the syndrome register 50. The same holds the change of the data S from logical "0" to logical "1", so as to record abnormal correction of the correction operation. Therefore, there is no need for OR circuits for 82 inputs. This feature also simplifies the circuit arrangement by reducing the number of necessary circuit components. Therefore, easy IC fabrication of the error correction control circuit can be realized as well.

In the present invention, the CPU is only necessary for issuing the start signal STR to start the error correction operation. Therefore, during the error correction operation, the CPU can be used for other processing.

It is evident that the present invention is applicable not only to a character broadcast receiver, but also to an ordinary error correction system.

The error correction operation also can be performed at a high speed, for there is no need for a delay circuit for synchronizing the outputting of the error correction signal with the supply of the data designated for correction. Consequently, the circuit size of the error correction control circuit can be reduced.

Additionally, the check for error correction can be made without any increase in the size of the circuit.

What is claimed is:

1. An apparatus for error correction, comprising:
   data storing means including first and second storage areas, the first storage area storing uncorrected code data as a data packet, the data packet having a data field and an error correction field including a predetermined number of bits;
   timing signal generating means for generating first and second timing signals, said second timing signal being generated a predetermined interval of time after said first timing signal;
   data readout means for reading the uncorrected data from the first storage area of the data storing means in response to the first and second timing signals, the uncorrected data being successively read out in predetermined increments of bits;
   switching means for switching between first and second lines, the first line for transmitting the uncorrected data read out in response to the first timing signal, and the second line for transmitting the uncorrected data read out in response to the second timing signal;
   error syndrome calculating means for calculating data errors in the uncorrected data transmitted through the first line and for generating an output representing the data errors;
   error detecting means for determining whether the uncorrected data includes a predetermined quantity of data errors based on the output of the error syndrome calculating means and for generating correction data representing a result of the determination;
   correction means for synchronously fetching the correction data generated by the error detecting means and the uncorrected data transmitted through the second line and for correcting errors in the uncorrected data in accordance with the correction data to thereby generate corrected data; and
   write means for successively writing the corrected data into the second storage area of the data storing means in said predetermined increments of bits.

2. An apparatus according to claim 1, wherein the uncorrected data represents a majority difference set cyclic code.

3. An apparatus according to claim 2, wherein the error syndrome calculating means comprises a syndrome register including a shift register for shifting a predetermined number of bits, and the error detecting means comprises a majority logic circuit which selects by a majority output bits of the syndrome register in predetermined combinations for generating said correction data in order to correct corresponding data errors in the uncorrected data.

4. An apparatus according to claim 3, further comprising corrected state detecting means for serially fetching, bit by bit, the contents of the syndrome register after the error correction has been performed by the correction means and for detecting whether the error correction was performed correctly by the correction means.

5. An apparatus for error correction, comprising:
   data storing means including first, second and third storage areas, the first storage area storing uncorrected code data as a data packet, the data packet having a data field and an error correction field including a predetermined number of bits;
   timing signal generating means for generating first, second, third and fourth timing signals with predetermined time delays therebetween;
   data readout means for reading the uncorrected data from the first storage area of the data storing means in response to the first and second timing signals, the uncorrected data being successively read out in predetermined increments of bits;
   first switching means for switching between first and second readout lines, the first readout line for transmitting the uncorrected data read out in response to the first timing signal, and the second readout line for transmitting the uncorrected data read out in response to the second timing signal;
   error syndrome calculating means for calculating data errors in the uncorrected data transmitted through the first readout line and for generating an output representing the data errors;
   error detecting means for determining whether the uncorrected data includes a predetermined quantity of errors based on the output of the error syndrome calculating means and for generating correction data representing a result of the determination;
   correction means for synchronously fetching the correction data generated by the error detecting means and the uncorrected data transmitted through the second readout line and for correcting errors in the uncorrected data in accordance with the correction data to thereby generate corrected data;

corrected state detecting means responsive to the output of said error syndrome calculating means for detecting whether the error correction was performed by the correction means after the error correction has been performed by the correction means and for generating an output representing the result of the detection;

second switching means for switching between first and second writing lines, the first writing line for transmitting the corrected data supplied from the correction means in response to the third timing signal, and the second writing line for transmitting the output of the corrected state detecting means in response to the fourth timing signal; and write means for successively writing into the second storage area of the data storing means in said predetermined increments of bits the corrected data supplied from the correction means through the first writing line and for writing in the third storage area of the data storing means the output of the corrected state detecting means supplied through the second writing line.

6. An apparatus according to claim 5, wherein the uncorrected data represents a majority difference set cyclic code.

7. An apparatus according to claim 6, wherein the error syndrome calculating means comprises a syndrome register including a shift register for shifting a predetermined number of bits, and the error detecting means comprises a majority logic circuit which selects by a majority output bits of the syndrome register in predetermined combinations for generating said correction data in order to correct corresponding data errors in the uncorrected data.

8. An apparatus according to claim 7, wherein the corrected state detecting means serially fetches, bit by bit, the contents of the syndrome register after the error correction has been performed by the correction means and for detecting whether the error correction was performed correctly by the correction means.

9. A method for error correction, comprising the steps of:

generating a first timing signal;

reading uncorrected code data out of a first area of a memory in response to the first timing signal, the first area of the memory storing the uncorrected data as a data packet, the data packet having a data field and an error correction field comprised of a predetermined number of bits;

performing syndrome calculation for determining data errors in the uncorrected data read out from said first area of memory;

determining whether the uncorrected data includes data errors based on the syndrome calculation and generating correction data if data errors are determined;

generating a second timing signal;

reading the uncorrected code data out of the first area of the memory in response to the second timing signal;

synchronously fetching both the correction data and the uncorrected data read out in response to the second timing signal;

performing error correction on said uncorrected data with said correction data so as to generate corrected data; and writing the corrected data into a second area of the memory.

10. A method according to claim 9, further comprising the steps of:

generating a third timing signal;

fetching the output of the syndrome calculation in response to the third timing signal for determining whether said error correction step was performed correctly; and writing data representing whether the error correction step was performed correctly into a third area of the memory.

* * * * *